US009243330B2

(12) United States Patent
Granneman et al.

(10) Patent No.: US 9,243,330 B2
(45) Date of Patent: *Jan. 26, 2016

(54) APPARATUS AND METHOD FOR HIGH-THROUGHPUT ATOMIC LAYER DEPOSITION

(75) Inventors: Ernst H. A. Granneman, Hilversum (NL); Sebastiaan E. van Nooten, Bilthoven (NL)

(73) Assignee: ASM INTERNATIONAL N.V., Almere (NL)

(*) Notice: Subject to any disclaimer, the term of this patent is extended or adjusted under 35 U.S.C. 154(b) by 523 days.

This patent is subject to a terminal disclaimer.

(21) Appl. No.: 12/993,562

(22) PCT Filed: May 20, 2009

(86) PCT No.: PCT/NL2009/050271
§ 371 (c)(1),
(2), (4) Date: Feb. 4, 2011

(87) PCT Pub. No.: WO2009/142488
PCT Pub. Date: Nov. 26, 2009

(65) Prior Publication Data
US 2011/0124199 A1    May 26, 2011

Related U.S. Application Data

(63) Continuation of application No. 12/123,745, filed on May 20, 2008, now abandoned.

(51) Int. Cl.
*C30B 25/14* (2006.01)
*C30B 29/20* (2006.01)
(Continued)

(52) U.S. Cl.
CPC ........... *C23C 16/54* (2013.01); *C23C 16/45551* (2013.01); *C30B 25/14* (2013.01); *C30B 29/20* (2013.01); *C30B 35/005* (2013.01); *H01L 21/67784* (2013.01)

(58) Field of Classification Search
CPC ............ H01L 21/677; H01L 21/67703; H01L 21/67784–21/67793; C23C 16/45525–16/45555; C23C 14/568; C23C 16/45519; C23C 16/54; C30B 25/14–25/165; C30B 29/20; C30B 35/005
USPC .......... 118/718, 719, 728; 156/345.2, 345.22, 156/345.23, 345.51
See application file for complete search history.

(56) References Cited

U.S. PATENT DOCUMENTS

| 4,058,430 A | 11/1977 | Suntola et al. |
| 4,413,022 A | 11/1983 | Suntola et al. |

(Continued)

FOREIGN PATENT DOCUMENTS

| WO | WO 2006/005214 | 1/2006 |
| WO | WO 2007/126585 | 11/2007 |

(Continued)

OTHER PUBLICATIONS

Levy, David H., "Stable ZnO thin film transistors by fast open air atomic layer deposition," American Institute of Physics, Applied Physics Letters 92, 192101 (2008).

*Primary Examiner* — Gordon R Baldwin
*Assistant Examiner* — Benjamin Kendall
(74) *Attorney, Agent, or Firm* — Preti Flaherty Beliveau & Pachios LLP

(57) ABSTRACT

Atomic layer deposition apparatus for depositing a film in a continuous fashion. The apparatus includes a process tunnel, extending in a transport direction and bounded by at least a first and a second wall. The walls are mutually parallel and allow a flat substrate to be accommodated therebetween. The apparatus further includes a transport system for moving a train of substrates or a continuous substrate in tape form, through the tunnel. At least the first wall of the process tunnel is provided with a plurality of gas injection channels that, viewed in the transport direction, are connected successively to a first precursor gas source, a purge gas source, a second precursor gas source and a purge gas source respectively, so as to create a tunnel segment that—in use—comprises successive zones containing a first precursor gas, a purge gas, a second precursor gas and a purge gas, respectively.

18 Claims, 9 Drawing Sheets

(51) Int. Cl.
*C30B 25/00* (2006.01)
*C23C 16/455* (2006.01)
*C23C 16/54* (2006.01)
*H01L 21/677* (2006.01)
*C30B 35/00* (2006.01)

(56) References Cited

U.S. PATENT DOCUMENTS

| | | | |
|---|---|---|---|
| 4,495,024 A * | 1/1985 | Bok | 216/57 |
| 4,587,002 A * | 5/1986 | Bok | 204/298.25 |
| 4,622,918 A | 11/1986 | Bok | |
| 4,874,273 A * | 10/1989 | Tokisue et al. | 406/88 |
| 6,183,565 B1 * | 2/2001 | Granneman et al. | 118/725 |
| 6,315,501 B1 * | 11/2001 | Yagai et al. | 406/198 |
| 6,719,499 B1 * | 4/2004 | Kuznetsov et al. | 406/90 |
| 6,746,237 B2 | 6/2004 | Storm et al. | |
| 6,824,619 B1 | 11/2004 | Kuznetsov et al. | |
| 6,872,421 B2 | 3/2005 | Hwang et al. | |
| 7,104,476 B2 | 9/2006 | Kim | |
| 7,456,429 B2 * | 11/2008 | Levy | 257/66 |
| 2004/0067641 A1 * | 4/2004 | Yudovsky | 438/680 |
| 2005/0217137 A1 | 10/2005 | Smith et al. | |
| 2007/0015374 A1 | 1/2007 | Granneman | |
| 2007/0160454 A1 * | 7/2007 | Iida | 414/806 |
| 2007/0281089 A1 | 12/2007 | Heller et al. | |
| 2009/0078204 A1 * | 3/2009 | Kerr et al. | 118/728 |

FOREIGN PATENT DOCUMENTS

| | | |
|---|---|---|
| WO | WO 2008/085474 | 7/2008 |
| WO | WO 2009/042044 | 4/2009 |
| WO | WO 2009/042147 | 4/2009 |

* cited by examiner

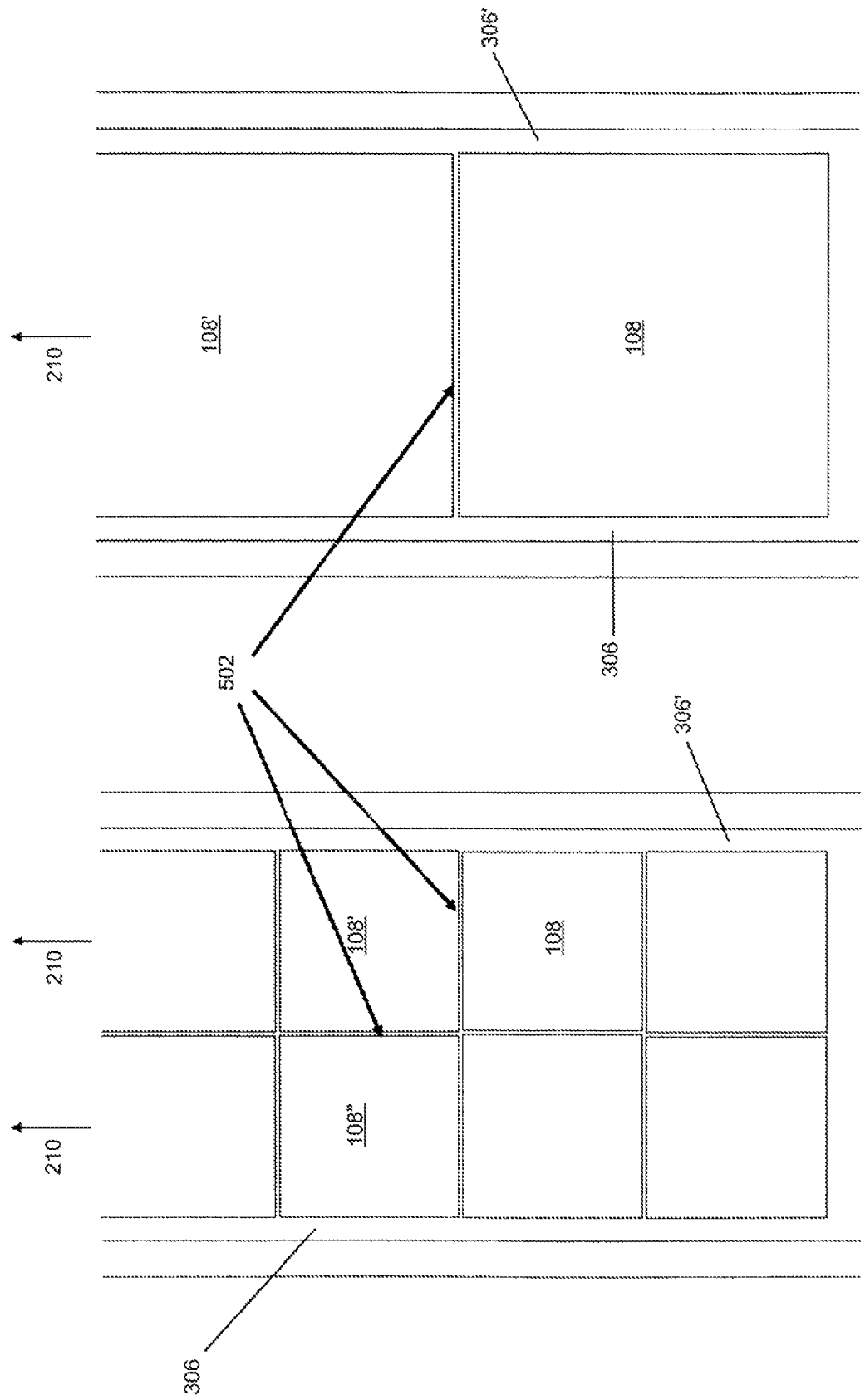

APPARATUS AND METHOD FOR HIGH-THROUGHPUT ATOMIC LAYER DEPOSITION

FIELD OF THE INVENTION

The invention relates to the field of semiconductor processing, and, more particularly, to an apparatus and method for the atomic layer deposition of films onto semiconductor substrates.

BACKGROUND

Atomic layer deposition (ALD) is a thin film deposition method that allows for the deposition of films having thicknesses on the order of nanometers in a precisely controlled way. Typically, ALD uses two or more gaseous precursors that are alternately and repeatedly applied to a substrate. A series of sequential steps in which a surface of the substrate is exposed to all precursors is called a deposition cycle. Each deposition cycle grows a single monolayer of film, or a fraction of a monolayer. This is due to the fact that in ALD the film growth depends on chemisorption, a process whereby a precursor molecule adheres to a substrate's surface through the formation of a chemical bond without further thermal decomposition of the precursor molecule taking place. Chemisorption stops naturally when all substrate surface sites available for chemical bonding with a precursor have been covered. Exposing the substrate to the second precursor results in a chemical reaction of the second precursor with the chemisorbed first precursor under the formation of a solid film, until all of the chemisorbed first precursor has been reacted and the substrate is covered with a layer of chemisorbed second precursor in a self-limiting manner. Consequently, ALD is a self-limiting layer-by-layer deposition method that offers highly conformal coating and excellent thickness control. These characteristics make it a method of interest to various industries, among which in particular the semiconductor, and more specifically, the solar cell industry.

In the solar cell industry, ALD may be used to deposit aluminum oxide ($Al_2O_3$) films for the passivation of advanced mono-Si solar cells. To this end typical film thicknesses of 5-15 nm are required, which can be achieved using traditional single or multi-wafer ALD systems. Currently, the throughput of the most efficient multi-wafer ALD systems at said film thickness is about 60 wafers per hour. The amount of surface area to be treated in order to obtain—for example—a solar cell panel for use on a rooftop, is considerable however. And with the demand for solar cell panels on the rise, there is an increasing need for ALD apparatus featuring a higher throughput.

The above-described ALD application is exemplary, and merely one of many in which the continual pressure within the semiconductor industry and related industries, such as solar cell industry or flat panel display industry, for an increased throughput is felt. It is therefore on object of the present invention to provide a device and a method for atomic layer deposition offering a much improved throughput capacity.

SUMMARY OF THE INVENTION

According to one aspect of the invention, an atomic layer deposition apparatus is provided for depositing a film onto a train of substrates, or a continuous substrate in tape form, in a continuous fashion. The apparatus includes a process tunnel, extending in a transport direction and bounded by at least a first and a second wall. The walls are mutually parallel and spaced apart so as to allow a substantially flat substrate, oriented parallel to the walls, to be accommodated there between. The apparatus further includes a transport system for carrying and moving a train of said substrates or a continuous substrate in tape form, from an entrance of the tunnel, along the transport direction, to an exit thereof. At least the first wall of the process tunnel is provided with a plurality of gas injection channels, which channels are disposed in a spaced apart manner along the transport direction and which channels, viewed in the transport direction, are connected successively to a first precursor gas source, a purge gas source, a second precursor gas source and a purge gas source respectively, so as to create a tunnel segment that—in use—comprises successive zones containing a first precursor gas, a purge gas, a second precursor gas and a purge gas, respectively. Two or more of such segments are disposed behind one another in the transport direction.

According to another aspect of the invention, a method for growing a thin film on a substrate is provided. The method includes providing a process tunnel that extends longitudinally in a transport direction from an entrance to an exit, and that is capable of accommodating one or more substantially flat substrates. The method also includes bringing about a longitudinal division of the process tunnel into two or more functional segments, wherein each segment comprises at least four laterally extending gas zones that successively contain a first precursor gas, a purge gas, a second precursor gas and a purge gas. The method further includes moving a substrate through the process tunnel into the transport direction, such that the substrate is successively subjected to the gases in the successive gas zones, and an atomic layer is deposited onto the substrate when it passes by all at least four zones of a single segment.

These and other features and advantages of the invention will be more fully understood from the following detailed description of certain embodiments of the invention, taken together with the accompanying drawings, which are meant to illustrate and not to limit the invention.

BRIEF DESCRIPTION OF THE DRAWINGS

FIG. 4 B is a diagrammatic longitudinal cross-sectional view of a portion of a process tunnel wherein the upper and lower tunnel walls are configured symmetrically;

FIG. 5 shows, schematically, a cross-sectional plan view of a portion of a process tunnel wherein two parallel streams of substrates are being transported;

FIG. 6 shows, schematically, a cross-sectional plan view of a portion of a process tunnel wherein a single stream of substrates is being transported;

DETAILED DESCRIPTION OF THE INVENTION

Figure 2:
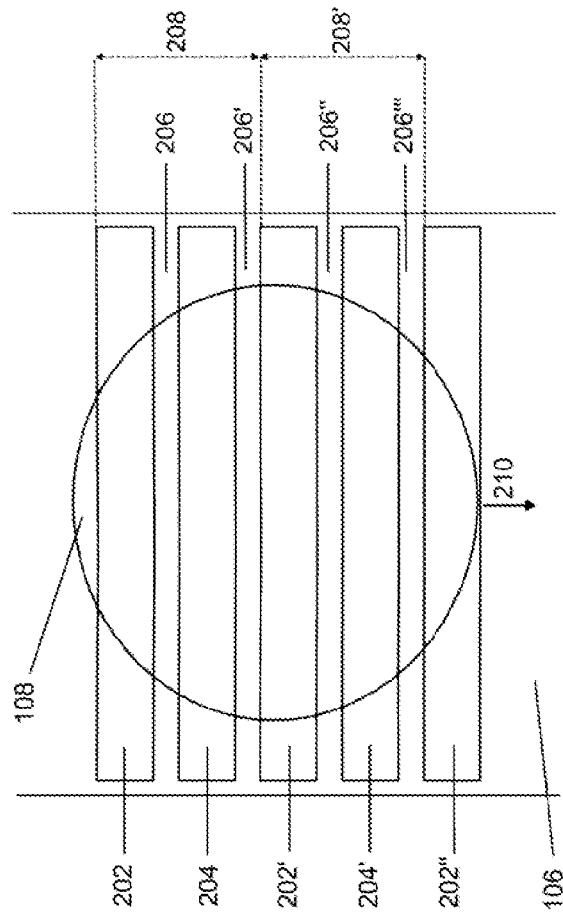
FIG. 2 shows, schematically, a cross-sectional plan view of a portion of the process tunnel shown in FIG. 1 as viewed along line A-A, illustrating the arrangement of segments and zones.

The apparatus provided by the present disclosure includes a process tunnel through which a substrate, preferably as part of a train of substrates, may be transported in a linear manner. That is, the substrate may be inserted into the tunnel at an entrance thereof to be conveyed to an exit. The tunnel is bounded by at least two, substantially parallel tunnel walls. Preferably, the tunnel walls are located close to both the substrate and each other, to provide an elongate processing space with a minimum of volume. In its longitudinal direction, the process tunnel may be divided into a series of segments, each segment comprising a number—typically four—of laterally extending gas zones. Successive zones within a segment contain gas injection channels for a first precursor gas, a purge gas, a second precursor gas, and a purge gas respectively. As the substrate is transported through the tunnel, its surface is subjected stripwise to contact with the different gases. If the arrangement of the zones and the respective gases are chosen properly, transporting a substrate through one tunnel segment is equivalent to subjecting it to one atomic layer deposition cycle. Since the tunnel may contain as many segments as desired, a film of arbitrary thickness may be grown on a substrate being conveyed from the entrance to the exit of the tunnel. The linear nature of the process tunnel allows for a continuous stream of substrates to be processed, thus delivering an atomic layer deposition apparatus with an appreciably improved throughput capacity.

It is noted that, in the appended figures, the same or similar devices, parts, spaces, orientations etc. may have been indicated by the same reference numeral. Also, for reasons of clarity, reference numerals in some figures may have been omitted when the object of reference is already identified in one or more preceding figures.

Figure 1:
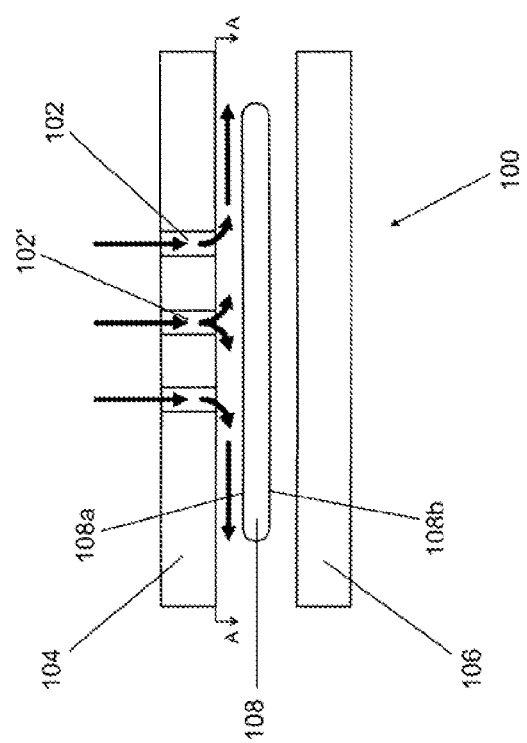
FIG. 1 is a diagrammatic lateral cross-sectional view of an exemplary disclosed atomic layer deposition apparatus, having two parallel tunnel walls between which a substrate is accommodated.

FIG. 1 is a diagrammatic cross-sectional illustration of an exemplary disclosed ALD apparatus 100, suitable for film deposition onto a single side 108a of a substrate 108. Apparatus 100 comprises a process tunnel, which is bounded by a first tunnel wall 104 and a second tunnel wall 106. Tunnel walls 104, 106 are substantially parallel and spaced apart from each other to allow substrate 108, for example a semiconductor wafer, to be accommodated therebetween. In the illustrated embodiment, tunnel walls 104 and 106 extend longitudinally in a transport direction perpendicular to the plane of the drawing of FIG. 1. In reality, the transport direction of the process tunnel is preferably parallel to the horizontal, meaning that the tunnel walls 104, 106 may be oriented horizontally (as shown) to define the process tunnel. It will be appreciated, however, that different orientations of the tunnel walls, such as a horizontally sloping orientation, or vertical orientation may be employed as well.

Tunnel wall 104 is fitted with a plurality of gas injection channels 102, 102' etc., the outflow openings of which may be distributed over the wafer facing (i.e. inside) surface of the tunnel wall, both along the lateral and the longitudinal direction thereof. In the illustration of FIG. 1, a lateral tunnel cross-section comprises three such channels. It is contemplated, however, that a lateral tunnel cross-section may include a greater or lesser number of gas injection channels 102.

The gas injection channels 102, 102', etc. are connected to gas sources (not shown in FIG. 1) that—in use—drive gas through the gas injection channels 102, 102', etc., into the tunnel space between the tunnel walls 104, 106. In general, gas injection channels at the same longitudinal position in the tunnel wall, such as gas injection channels 102 and 102' in FIG. 1, are connected to sources of the same gas or gas mixture. As gas may be injected into the tunnel space over the whole length of the tunnel, gas inside the tunnel space flows laterally through the gaps between the tunnel walls 104 and 106 and the substrate towards the edges of the substrate and beyond, as shown in FIG. 1, provided that it can escape at both lateral sides of the tunnel to exhaust channels, not shown. The exhaust channel is preferably held at atmospheric pressure so that vacuum pumps are not needed. Alternatively, the exhaust channel may be held at a pressure that deviates from atmospheric pressure.

FIG. 2 schematically shows a cross-sectional plan view of a portion of the process tunnel shown in FIG. 1 as viewed along line A-A. Seen along direction 210, the lateral gas flows described above form successive, approximately tunnel wide zones of gas 202, 206, 204, 206', etc. Successive zones may be grouped into segments. Preferably, the gas injection channels 102, 102', etc. are configured to provide a sequence of segments 208, 208', etc., wherein each segment comprises, in succession along the transport direction 210, a first precursor gas zone 202, a purge gas zone 206, a second precursor gas zone 204, and another purge gas zone 206'. The precursor gas zones 202, 204, etc. may contain a gas mixture including both the respective precursor and an inert carrier gas, whereby the latter is added to facilitate transport of the precursor. The purge gas zones 206, 206', etc. may be arranged between any two zones 202, 204, etc. containing mutually reactive precursors. They serve as gas phase diffusion barriers that separate bordering precursor zones, and thus keep the two mutually reactive precursors separated in the gas phase and allowing only chemical reactions of the precursors on the substrate surface.

In FIG. 2, substrate 108 is transported through the tunnel in transport direction 210. Its surface 108a is thereby subjected stripwise to the gas present in each of the zones 202, 206, 204, 206', etc. When a strip of surface area has passed all zones of a single segment 208, 208', etc., it has undergone a full deposition cycle. The transport velocity of substrate 108 through the process tunnel is to be chosen such that, when passing a specific precursor zone, a strip of substrate surface area is exposed to the precursor sufficiently long to ensure that it is fully saturated. As this is the criterion to be fulfilled, a longer precursor zone generally allows for a higher transport velocity, and vice versa. Note, however, that the saturation time may depend on the nature of the precursor being used, and on the concentration of the precursor in the respective zone.

The dimensions and working parameters of the disclosed atomic layer deposition apparatus may vary, depending on the specific application it is built and used for. For example, depositing a 10 nm film of aluminum oxide onto a standard circular 300 mm silicon wafer may involve two precursors, tri-methyl aluminum ($Al(CH_3)_3$, TMA) and water ($H_2O$). As an alternative for water, ozone ($O_3$) may be used. Nitrogen ($N_2$) may be used both as an inert carrier gas in the precursor zones and as purge gas in the purge gas zones. Each of the zones may have a length of several centimeters, typically 2-5 cm, in the transport direction. To accommodate a single stream of wafers having a lateral dimension of 300 mm, the width of the process tunnel needs to measure a little over 300 mm. In case a precursor zone measures 5 cm in length, whereas a purge gas zone measures 2 cm, the length of a single tunnel segment amounts to 0.14 m. As a single tunnel segment is responsible for depositing one monolayer of aluminum oxide of about 0.1 nm thickness, a total of 100 segments is required to grow a 10 nm film. Consequently, the length of the process tunnel comes to approximately 14 meters. Wafers may be transported through the tunnel at a speed as high as 0.25 m/s, which, for this specific example, would lead to a throughput capacity of about 3000 wafers per hour.

A general measure that may be taken to further increase the throughput capacity of a disclosed ALD apparatus is to widen the process tunnel, so as to enable it to accommodate two or more parallel streams of substrates. See for example FIG. 5. Doubling the width of the tunnel potentially doubles the throughput of the apparatus.

Figure 4A:
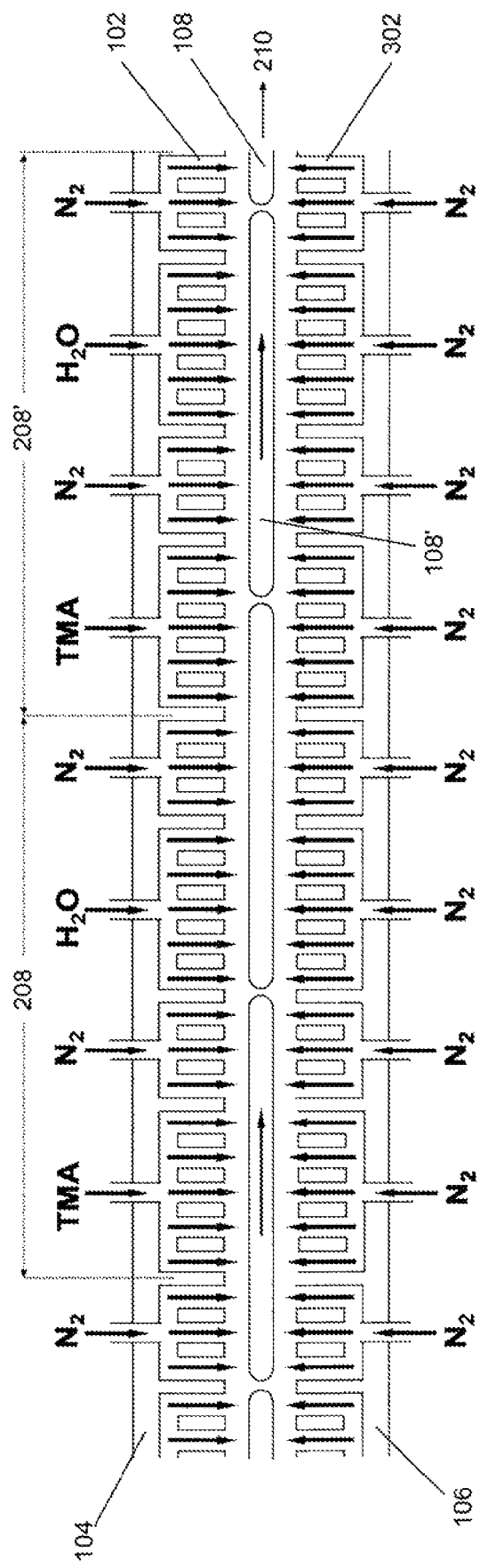
FIG. 4 A is a diagrammatic longitudinal cross-sectional view of a portion of a process tunnel wherein the upper and lower tunnel walls are configured asymmetrically.
Figure 4B:
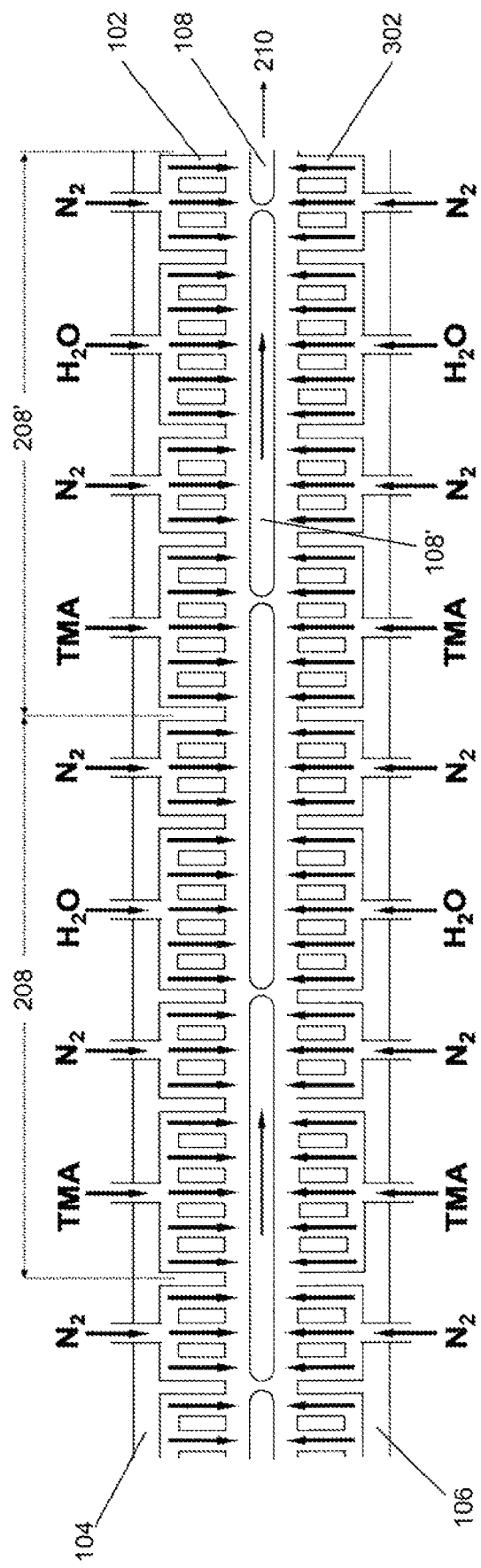

Another general measure is providing both the first and the second tunnel wall with gas injection channels, wherein an inert bearing gas may be provided from the bottom wall, as shown in FIG. 4A, for floatingly supporting the wafers by a gas cushion. Alternatively, the first and second tunnel wall are symmetrical in that opposite gas injection channels are connected to gas sources of substantially the same gas composition as shown in FIG. 4B. This configuration allows for simultaneous deposition on both sides 108*a*, 108*b* of a substrate 108, if needed, thus doubling the amount of treated substrate surface area. FIGS. 4A and 4B will be discussed further below.

FIG. 1 and FIG. 2 do not show a transport system for carrying and moving a substrate through the process tunnel. A transport system for this purpose may, for example, be of the conventional conveyor belt-type. Another example may include carriers onto which substrates are loaded. The carriers may be propelled by a suitable drive system. Drive systems for carriers are known in the art and need not be elaborated upon here.

Figure 3:
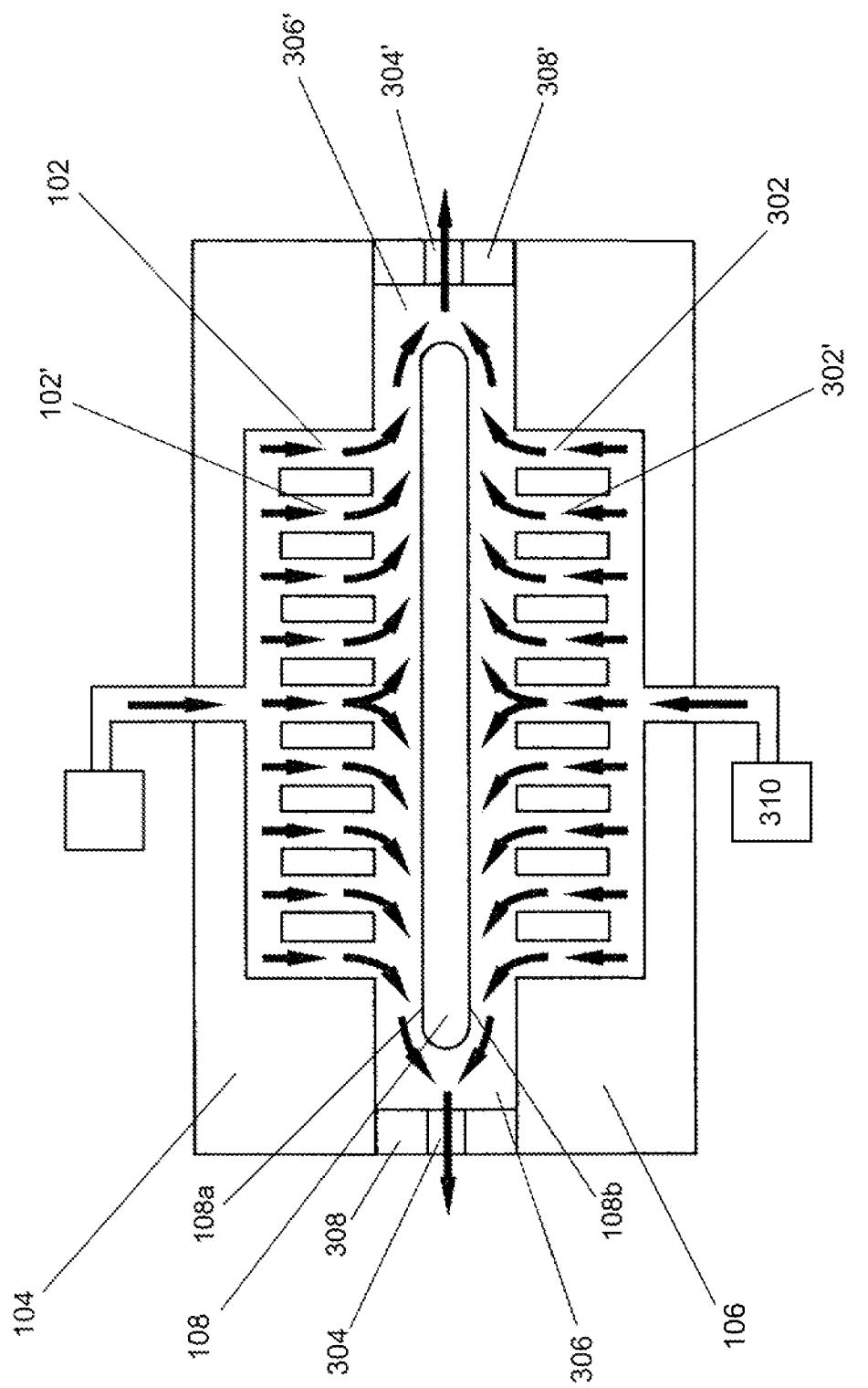
FIG. 3 is a diagrammatic lateral cross-sectional view of another exemplary embodiment of an atomic layer deposition apparatus according to the present invention.

FIG. 3 diagrammatically illustrates a lateral cross-sectional view of a preferred embodiment of the invention, featuring a transport and wafer support system based on the floating wafer technology developed by applicant. Said floating wafer technology is described in more detail in U.S. Pat. No. 6,183,565, and U.S. Pat. No. 6,719,499 which are hereby incorporated by reference. In this embodiment, the tunnel walls 104, 106 are oriented horizontally, while they are preferably connected in the vertical direction by side walls 308, 308'. The support system comprises a plurality of gas injection channels 302, 302', etc., disposed in the second tunnel wall 106 below the first tunnel wall 104, through which gas may be injected into the tunnel space by a source 310. Once injected into the tunnel space, the gas flows sideways towards the gas exits 304, 304' in the side walls 308, 308'. The sidewalls 308, 308' themselves restrict the outflow, and cause pressure to be built up in the tunnel space regions 306, 306', which helps to stabilize the lateral position of floating substrate 108. From a structural point of view, the upper and lower tunnel walls may be identical. The gas injected through the channels 302, 302', etc., may be the same along the entire length of the tunnel if its primary purpose is to provide a gas bearing.

FIG. 4A illustrates a longitudinal cross-sectional view of a portion of a process tunnel. FIG. 4A depicts two identical tunnel segments 208, 208'. Each segment 208, 208' comprises two series of gas injection channels, one series in the upper tunnel wall 104, and one series in the lower tunnel wall 106. The two series are oppositely aligned with respect to each other, and thus contribute to the formation of successive gas zones that stripwise envelop the substrates laterally. Viewed in transport direction 210, the gas injection channels of a segment 208, 208' in the upper wall 104 successively inject a first precursor gas (tri-methyl aluminum, TMA), a purge gas (nitrogen, $N_2$), a second precursor gas (water vapor, $H_2O$) and purge gas ($N_2$) respectively. The specific gases are, of course, exemplary: they may be chosen as desired. The gas injection channels of a segment 208, 208' in the bottom tunnel wall 106 all inject N2 as a bearing gas which simultaneously serves as a purge gas. Such a gas bearing provides the benefit of preventing precursors that are present in the flows above the wafer to penetrate the space below it. As a result, no backside deposition occurs as a result of unintentional ALD or chemical vapor deposition.

An alternative configuration is shown in FIG. 4B wherein the lower tunnel wall 106 is configured symmetrically relative to upper tunnel wall 104, in that opposite gas injection channels are connected to gas sources of substantially the same gas composition. Regarding the choice of gases, it is worth noting that in the apparatus mixed films may be deposited fairly easily by adding or inserting segments that comprise a different combination of precursors.

In FIG. 4, as in the preceding figures, any two precursor zones are separated by a purge gas zone. Given the relatively narrow gaps between the substrates 108, 108', etc. and the tunnel walls 104, 106—preferably less than 2 mm, more preferably less than 1 mm most preferably from 0.15 to 0.25 mm—, this separation is very effective in preventing the precursors from mixing. Consequently, hardly any deposition occurs on the tunnel walls, and the apparatus will have very low particle levels during operation.

Further, in contrast to any other ALD system known to date, the apparatus may operate at atmospheric pressure. No vacuum pumps are necessary to reduce the pressure in the tunnel space. Operation at around 1 atmosphere is feasible due to the combination of narrow gaps between the substrates 108, 108', etc. on the one hand, and the tunnel walls 104, 106 on the other, and a high gas flow. In the proposed apparatus, typical gas flow velocities lie in the range of 1-2 m/s.

Due to the absence of tunnel wall deposition and vacuum pumps, said apparatus may be virtually maintenance free.

The transport system based on the floating wafer technology, as shown in FIG. 4, is not complete: although it does carry the substrates 108, 108', etc., it does not move them in transport direction 210. To this end, the transport system must be complemented with means for driving the substrates. Various options may be considered.

In a first option, a driving force is applied to a train of substrates at a single location, preferably at the entrance of the process tunnel. The force may, for example, be applied by an insertion mechanism that continuously or semi-continuously inserts a new (last) wafer into the tunnel for processing. It may use the new wafer to push the train of substrates already present in the tunnel forward. As all substrates in the tunnel are floating, the force required to do so is relatively small. Each of the substrates already in the tunnel is driven in the transport direction by a next wafer in line, due to physical contact between their edges. As a constant throughput speed is not essential to the self-limiting atomic layer deposition process, hiccups in the supply of new wafers—which would automatically influence the transport speed of the wafers in the tunnel—do not influence the quality or thickness of the deposited layers. This first option is illustrated in FIG. 5, for two parallel trains of square substrates 108, 108', etc., and in FIG. 6, for a single train of square substrates. Reference numeral 502 marks some edge positions where physical contact occurs between the substrates.

Figure 7:
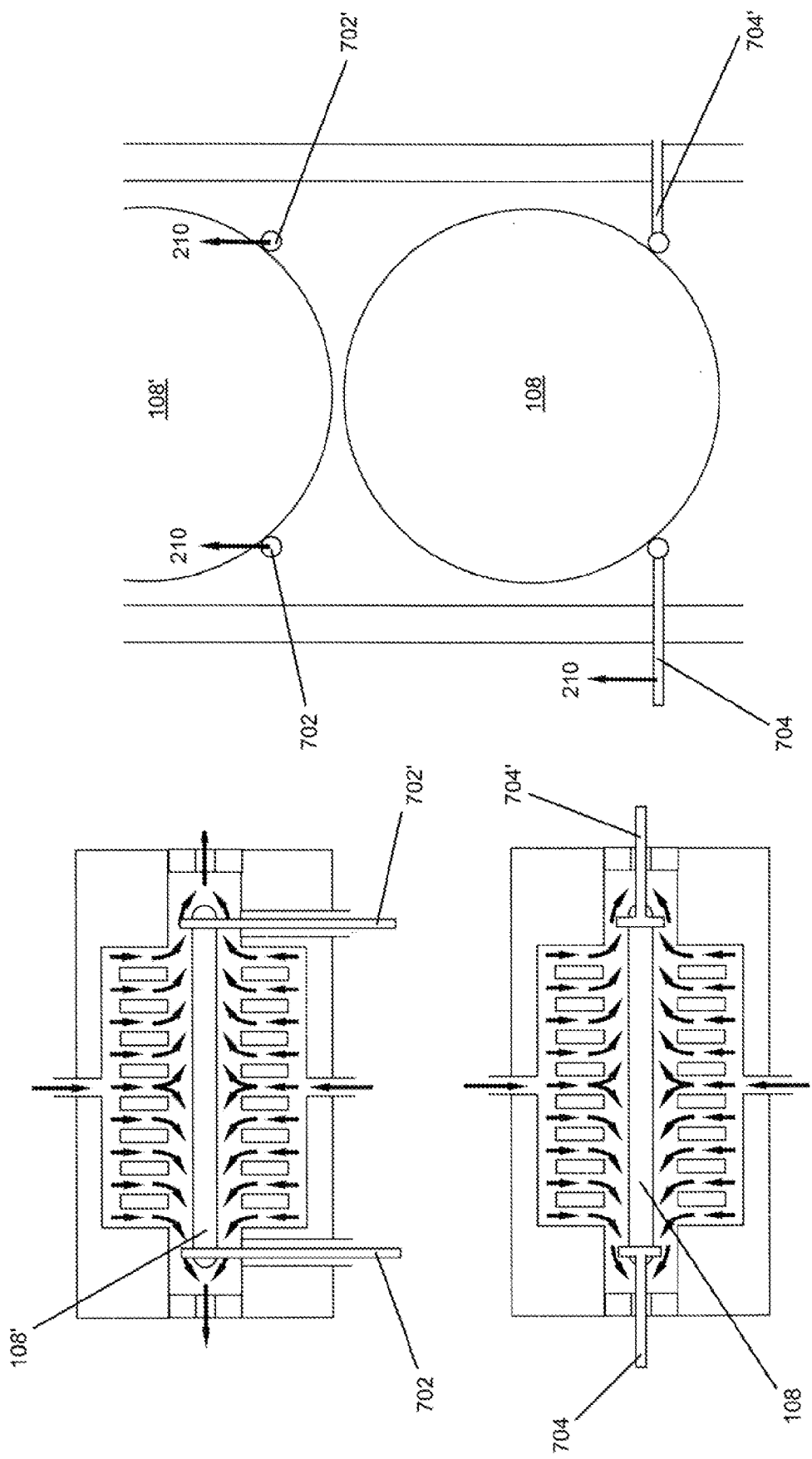
FIG. 7 illustrates how pins may be used to drive individual substrates through a process tunnel.

In a second option, illustrated by FIG. 7, substrates 108 and 108' are engaged individually by drive pins 702, 702', and 704, 704' of the transport system. The drive pins may reach into the tunnel space from below (pins 702, 702'), from the side (704, 704'), or any other orientation desired. Preferably, the drive pins engage a substrate at its circumferential edge, so no valuable substrate surface area needs to be sacrificed. The drive pins may be connected to a belt-type drive unit, to move the drive pins along the tunnel track, and back, in a continuous fashion. As the drive pins move along with the respective substrates through the process tunnel, they undergo coating. To reduce the amount of material deposited onto the drive pins, purge gas may be supplied into the tunnel space, closely alongside of the pins. This measure increases the time between servicing of the drive pins, which typically involves etching of their surfaces, and/or replacement.

Figure 8:
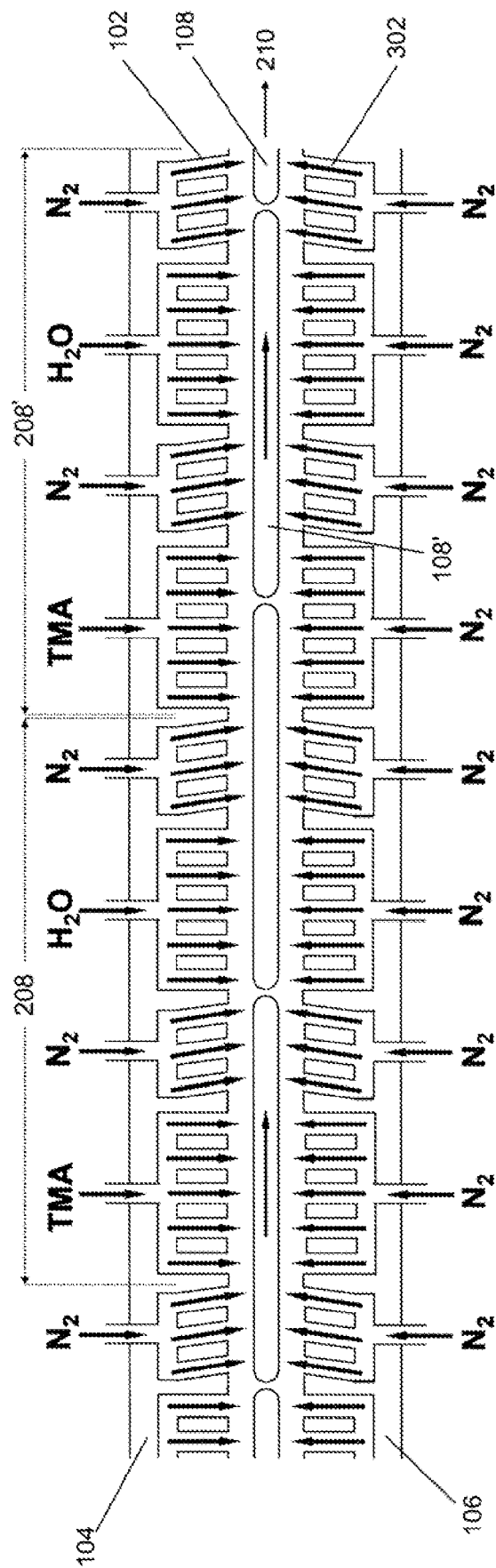
FIG. 8 is a diagrammatic longitudinal cross-sectional view of a portion of a process tunnel, wherein a number of gas injection channels inject gas into the tunnel at an angle with the vertical, to drive substrates into the transport direction.

A third option is illustrated in FIG. 8. In the schematically shown embodiment of the apparatus, the purge gas (nitrogen, $N_2$) injections channels are disposed at an angle such that the tangential component of the gas flows drives the substrates 108, 108', etc. in the transport direction 210. The magnitude of the purge gas flows can be used to control their forward speed. Which gas injection channels to place at an angle may be subject to design considerations, but in principle, any gas injection channel may do. A major advantage of this third option is that it does not involve any moving parts that may wear, or may undergo coating inside the process tunnel. It therefore contributes significantly to the low maintenance-character of the deposition apparatus.

A fourth option is to provide grooves in the tunnel walls, the grooves being elongated in the longitudinal direction and having one end proximate a gas injection channel, as disclosed in U.S. Pat. No. 6,824,619 of applicant, which is incorporated herein by reference, where it is used to impart a rotational movement on a floating substrate. Similarly, this method can be used to impart a linear movement to a substrate.

As the quality of a film may depend on the surface temperature of the substrate during processing, substrates may be preheated before being subjected to the deposition process. Preheating of a substrate may be done by providing the deposition apparatus with a special pre-heat tunnel segment, located upstream of the first reactive tunnel segment, i.e. the first tunnel segment wherein a substrate is subjected to two or more precursors. In the pre-heat tunnel segment, a substrate may be brought into contact with no more than a purge gas, which is kept at the same or at a higher temperature than that of the reactive sections. Similarly, a cool-down segment may be provided at the end of the process tunnel, downstream of the last reactive tunnel segment. As the primary purpose of the purge gas in the pre-heat and cool-down segments is to transfer heat, helium—which has a relatively high thermal conductivity—is a good choice that helps to minimize the length of such a segment.

Further, to facilitate the loading and discharging of substrates into/from the process tunnel by a mechanical substrate handler, a first and a last segment of the tunnel—reactive or non-reactive—may be provided with a larger gap between the tunnel walls to increase the gap between the upper and lower surface of an inserted wafer and the upper and lower tunnel wall respectively. A larger gap between the tunnel walls and the substrate comes at the penalty of an increased gas flow rate, since the force to be delivered by the gas bearing to carry the weight of the substrate does not change.

Figure 9:
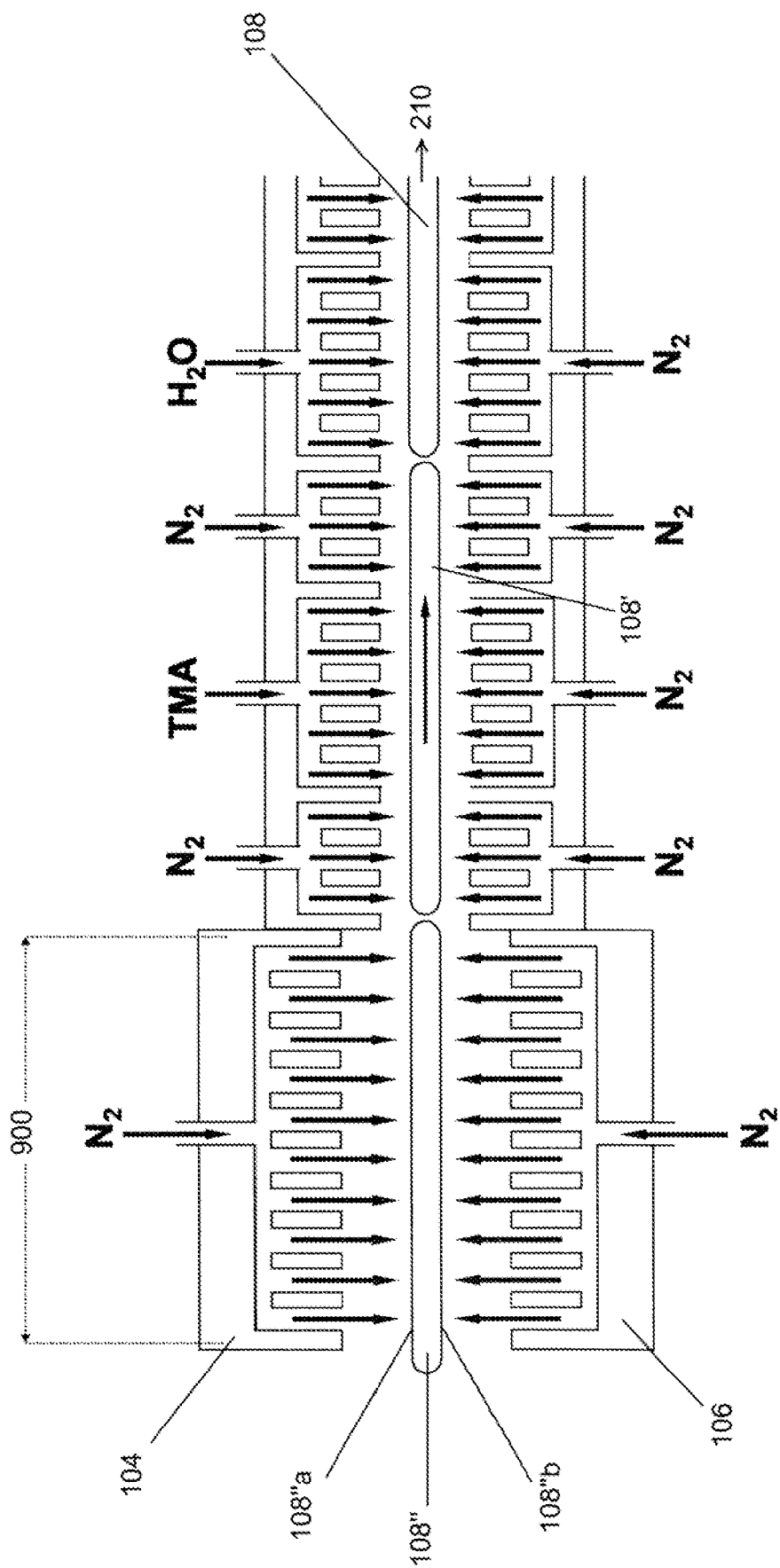
FIG. 9 is a diagrammatic longitudinal cross-sectional view of a portion of a process tunnel, provided with an entrance section with an enlarged gap between the tunnel walls.

FIG. 9 schematically illustrates a longitudinal cross-sectional view of an entrance section 900 of a process tunnel with an enlarged gap between the tunnel walls. Since a typical gap between the tunnel walls 104, 106 and the respective substrate surfaces 108"$a$, 108"$b$ measures less than 1 mm, and preferably between 0.15 and 0.25 mm, it is worth noting that an 'enlarged gap' may measure as little as 0.8 mm plus the thickness of a substrate (thus about 0.4 mm from each side of the substrate to the respective tunnel wall). The depicted entrance section 900 may also serve as a preheat segment. For this purpose, it is injected with heated $N_2$, and made long enough to ensure that a substrate 108" is properly warmed up to the desired processing temperature. To achieve proper warming, the transport velocity of a substrate and the width of the gap between the substrate and tunnel wall surfaces are parameters to be taken into account. After all, a higher transport velocity will reduce the length of stay of a substrate in the preheat segment, whereas with a larger gap heating of a substrate will be more gradual. In case entrance section 900 does not itself serve as a pre-heat segment, or does not perform the pre-heating adequate enough, an additional pre-heat section, not shown, with small gap may follow after the entrance section wherein no process gases are introduced but only $N_2$, to allow for adequate heating of the substrate before the ALD deposition process commences as discussed before. Assuming a wafer velocity of 0.25 m/s and a heat-up time of 4 s, a pre-heat length of 1 m would be required. Alternatively, gases with a higher thermal conductivity such as He and $H_2$ can be used as a heating gas in the entrance or pre-heat section instead of $N_2$, although $N_2$ is preferred because of its relatively low cost.

Figure 10B:
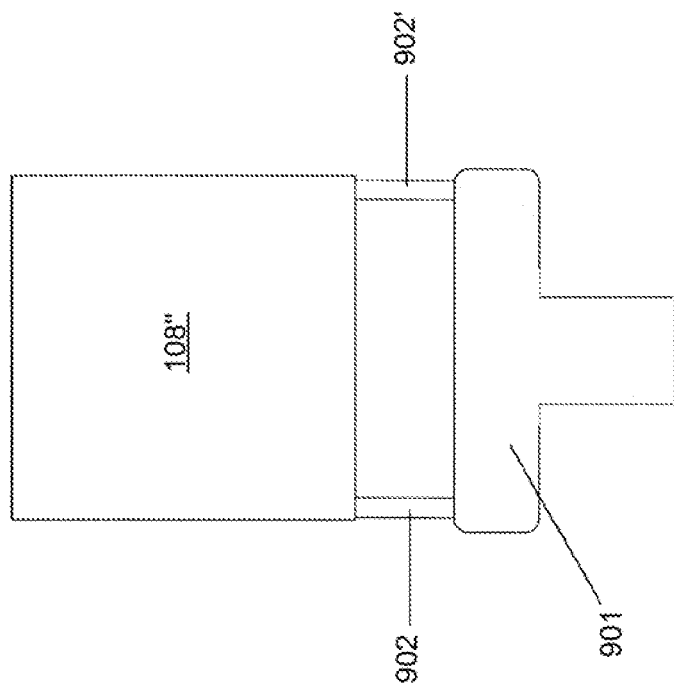
FIG. 10B illustrates an exemplary embodiment of a mechanical substrate handler.
Figure 10A:
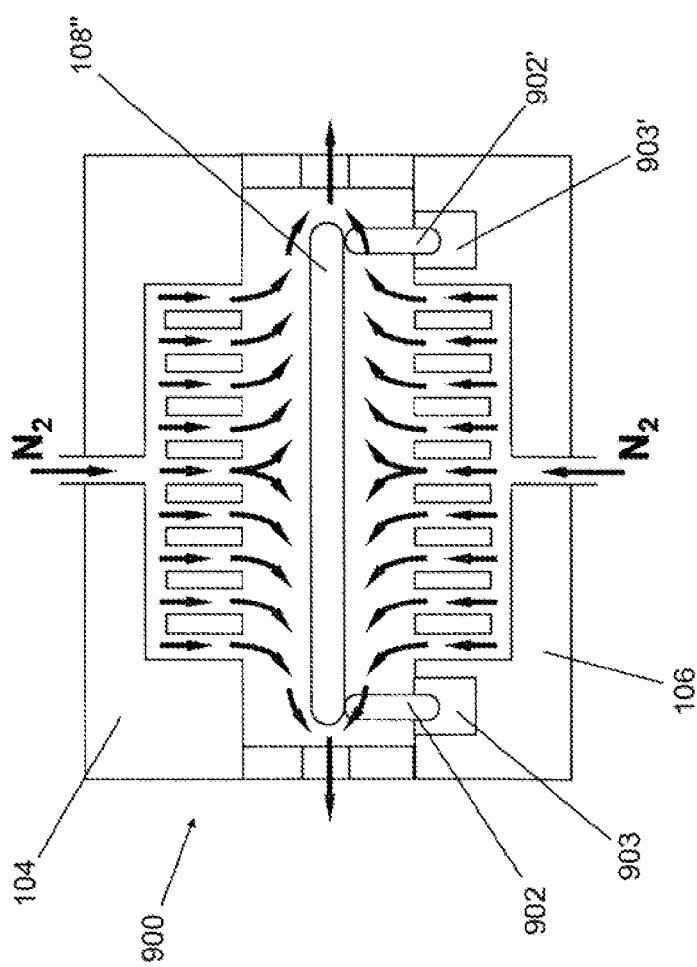
FIG. 10A shows, schematically, a lateral cross-sectional view of an entrance section of a process tunnel.

Entrance section 900 is shown schematically in a lateral cross-sectional view in FIG. 10A. The figure aims to illustrate how a mechanical substrate handler 901 (shown in a top view in FIG. 10B), having fork teeth 902, 902' configured for supporting a substrate 108", inserts said substrate into the tunnel segment 900. When substrate 108" is inserted into entrance section 900 by substrate handler 901, the $N_2$ gas bearing inside the tunnel segment will take over the load. Wafer handler 901 may then lower its teeth 902, 902' a bit (further) into the elongated recesses 903, 903', and retract from the tunnel.

Above, the invention has been described in terms of a first and a second precursor. One skilled in the art will recognize, however, that ALD may be performed using more than two precursors. It is emphasized here, that the language of the claims does not intend to exclude an atomic layer deposition apparatus featuring three, four or more precursors. To that end, each segment may comprise three, four or more precursor gas injection zones all separated by purge gas injection zones. Also nanolaminate films may be deposited. For this purpose, a number of successive segments of a first configuration for depositing a number of monolayers of a first film having a first composition, can be alternated by a number of successive segments of a second configuration, for depositing a number of monolayers of a second film having a second composition. And this sequence of segments can be repeated until the desired number of nanofilms is deposited.

The substrate may have a circular form, a square form, a rectangular form or triangular form or any other form that is available. Preferably, the form of the substrate is such that it allows a good filling of a surface area when the substrates are placed adjacent to each other, such as a square or rectangular form.

In an alternative embodiment, the substrate may be a flexible material such as a foil or tape that is fed through the apparatus. The material may be available in tape format, from a roll, and collected at the exit side of the apparatus on a collection roll. The material can be pulled through the apparatus by a pulling force exerted by the collection roll. Gas injection from both the upper and lower tunnel walls make that the tape will flow with very little friction through the apparatus.

Although as an example material only aluminum oxide is disclosed, it will be clear that the apparatus and method of the invention can be applied in combination with all precursor materials and film compositions that are now known in the art.

Further, while the invention has been described with reference to certain embodiments, it will be understood by those skilled in the art that various changes may be made and equivalents may be substituted for elements thereof without departing from the scope of the invention. In addition, many modifications may be made to the teachings of the invention to adapt to a particular situation without departing from the essential scope thereof. Therefore, it is intended that the invention may not be limited to any particular embodiment disclosed for carrying out this invention, but that the invention includes all embodiments falling within the scope of the appended claims.

We claim:

1. An atomic layer deposition apparatus, comprising:
a first, lower wall;
a second, upper wall parallel to the first wall and spaced apart from the first wall;
two side walls connecting the first and the second wall at lateral sides thereof;
wherein the first wall, the second wall and the two side walls bound a process tunnel configured to allow a substantially flat substrate, oriented parallel to said first and second walls, to be accommodated in the process tunnel leaving a first narrow gap between an upper side of the substrate and the second wall and a second narrow gap between a lower side of the substrate and the first wall, the process tunnel having a longitudinal direction which, in use, is a transport direction of the substrate in the process tunnel, and the process tunnel having a lateral direction that is substantially perpendicular to the longitudinal direction and parallel to the first and second wall, the first wall defining a lower, innermost boundary of the process tunnel and the second wall defining an upper, innermost boundary of the process tunnel;
a transport system configured to support and move a train of substrates or a continuous substrate in tape form, from an entrance of the process tunnel, along the transport direction, to an exit of the process tunnel;
wherein both the first wall and the second wall of the process tunnel are provided with a plurality of gas injection channels,
wherein outflow openings of said plurality of gas injection channels are distributed over respective inner-most surfaces of the process tunnel in a spaced apart manner both along the transport direction and in the lateral direction, said plurality of gas injection channels being configured to inject gas into the process tunnel so as to form gas bearings for floatingly supporting the substrate, and
a plurality of gas exits accommodated in both of the two side walls and configured to exhaust gas from tunnel space regions between both lateral edges of the substrate and the respective side walls, the plurality of gas exits being the only gas exits of the process tunnel, wherein the plurality of gas exits are dimensioned to restrict an outflow of gas from the process tunnel during use so as to cause pressure buildup and to stabilize a lateral position of the substrate;
wherein gas injection channels of the plurality of gas injection channels which are located in the first wall, viewed in the transport direction, are connected successively to a first precursor gas source, a first purge gas source, a second precursor gas source and a second purge gas source respectively, so as to create a tunnel segment that—in use—comprises, in succession along the transport direction, laterally extending zones containing a first precursor gas, a first purge gas, a second precursor gas and a second purge gas, respectively,
wherein two or more of such tunnel segments are disposed in succession in the transport direction;
wherein positions of the plurality of gas injection channels and positions of the plurality of gas exits are configured to provide that said gases in said zones flow substantially in the lateral direction towards the plurality of gas exits; and
wherein the zone containing the first purge gas and the zone containing the second purge gas create gas phase diffusion barriers that keep the first and the second precursor gases separated.

2. The atomic layer deposition apparatus according to claim 1, wherein the first and the second walls are spaced apart such that each of the first narrow gap and the second narrow gap measures 2 mm or less.

3. The atomic layer deposition apparatus according to claim 2, wherein the first and the second walls are spaced apart such that each of the first narrow gap and the second narrow gap measures 1 mm or less.

4. The atomic layer deposition apparatus according to claim 3, wherein the first and the second walls are spaced apart such that each of the first narrow gap and the second narrow gap is in the range of 0.15-0.25 mm.

5. The atomic layer deposition apparatus according to claim 1, wherein the first and second walls are oriented substantially horizontally, and wherein the second wall is located above the first wall.

6. The atomic layer deposition apparatus according to claim 1, wherein the gas injection channels in the second wall are connected to a source of inert gas.

7. The atomic layer deposition apparatus according to claim 1, wherein the first and second walls are symmetrical in that opposite gas injection channels are connected to gas sources of substantially identical gas compositions.

8. The atomic layer deposition apparatus according to claim 1, wherein at least one gas injection channel of the plurality of gas injection channels is configured to inject gas into the process tunnel in a direction having a positive component in the transport direction.

9. The atomic layer deposition apparatus according to claim 8, wherein said at least one gas injection channel is connected to a third purge gas source.

10. The atomic layer deposition apparatus according to claim 1, wherein the process tunnel can accommodate two or more parallel trains of substrates to be processed.

11. The atomic layer deposition apparatus according to claim 1, wherein the transport system comprises one or more drive pins configured to engage an individual substrate at a circumferential edge, and to move said individual substrate along the transport direction through the process tunnel.

12. The atomic layer deposition apparatus according to claim 1, wherein one of the entrance of the process tunnel and the exit of the process tunnel is provided with at least one end portion having an enlarged gap between the tunnel walls.

13. The atomic layer deposition apparatus according to claim 12, wherein gas injection channels of the plurality of gas injection channels which are located in the at least one end portion is connected to a nitrogen ($N_2$) or helium source (He).

14. The atomic layer deposition apparatus according to claim 1, wherein the first precursor gas is tri-methyl aluminum ($Al(CH_3)$) and wherein the second precursor gas is water ($H_2O$).

15. The atomic layer deposition apparatus according to claim 1, wherein nitrogen ($N_2$) is used as the first purge gas or the second purge gas.

16. The atomic layer deposition apparatus according to claim 1, wherein a number of the two or more tunnel segments corresponds with a desired film thickness.

17. The atomic layer deposition apparatus according to claim 1, comprising one or more tunnel segments of a first configuration for injecting a first combination of precursor gases, and one or more tunnel segments of a second configuration for injecting a second combination of precursor gases.

18. The atomic layer deposition apparatus according to claim 1, wherein the first and second walls are oriented substantially horizontally, and wherein the second wall is located above the first wall.

* * * * *